(12) United States Patent
Cok et al.

(10) Patent No.: US 7,662,663 B2
(45) Date of Patent: Feb. 16, 2010

(54) OLED PATTERNING METHOD

(75) Inventors: Ronald S. Cok, Rochester, NY (US); Christopher B. Rider, Hardwick (GB)

(73) Assignee: Eastman Kodak Company, Rochester, NY (US)

( * ) Notice: Subject to any disclaimer, the term of this patent is extended or adjusted under 35 U.S.C. 154(b) by 34 days.

(21) Appl. No.: 11/692,381

(22) Filed: Mar. 28, 2007

(65) Prior Publication Data

US 2008/0241989 A1 Oct. 2, 2008

(51) Int. Cl.
*B05D 3/06* (2006.01)
*H01L 21/00* (2006.01)

(52) U.S. Cl. .......... 438/106; 427/555; 427/64; 427/68; 427/556; 427/17; 438/99; 438/478; 257/797

(58) Field of Classification Search .......... 438/106, 438/99; 427/555
See application file for complete search history.

(56) References Cited

U.S. PATENT DOCUMENTS

| | | | |
|---|---|---|---|
| 4,210,711 A * | 7/1980 | Kitajima et al. | 430/253 |
| 4,247,619 A * | 1/1981 | Cohen et al. | 430/253 |
| 4,476,292 A | 10/1984 | Ham et al. | |
| 4,769,292 A | 9/1988 | Tang et al. | |
| 5,234,790 A * | 8/1993 | Lang et al. | 430/253 |
| 5,247,190 A | 9/1993 | Friend et al. | |
| 5,522,963 A | 6/1996 | Anders, Jr. et al. | |
| 5,747,222 A * | 5/1998 | Ryu | 430/312 |
| 5,846,361 A * | 12/1998 | Fasano et al. | 156/89.16 |
| 6,146,715 A * | 11/2000 | Kim et al. | 427/555 |
| 6,168,207 B1 * | 1/2001 | Nishizawa | 283/91 |
| 6,703,298 B2 | 3/2004 | Roizin et al. | |
| 6,756,317 B2 * | 6/2004 | Sniegowski et al. | 438/745 |
| 2003/0022403 A1 * | 1/2003 | Shimoda et al. | 438/14 |
| 2003/0087476 A1 * | 5/2003 | Oohata et al. | 438/108 |
| 2003/0203551 A1 * | 10/2003 | Cok et al. | 438/200 |

(Continued)

FOREIGN PATENT DOCUMENTS

JP  2-30748  2/1990

(Continued)

OTHER PUBLICATIONS

Tang et al., Applied Physics Letter, 51, 913 1987.

(Continued)

*Primary Examiner*—Charles D Garber
*Assistant Examiner*—Pape Sene
(74) *Attorney, Agent, or Firm*—Stephen H. Shaw; Raymond L. Owens

(57) ABSTRACT

A method of patterning a substrate according to several steps, including: a) mechanically locating a first masking film over the substrate; and b) segmenting the first masking film into a first masking portion and one or more first opening portions in first locations. Next, mechanically locate a first removal film over the first masking portion and first opening portions. Afterwards, one or more of the first opening portions are adhered to the first removal film. The first removal film and one or more of the first opening portions adhered to the first removal film are mechanically removed to form one or more first openings in the first masking film. Finally, materials are deposited over the substrate through the first openings in the first masking film.

16 Claims, 22 Drawing Sheets

U.S. PATENT DOCUMENTS

| | | | |
|---|---|---|---|
| 2003/0211406 A1* | 11/2003 | Keusseyan | 430/14 |
| 2006/0099731 A1* | 5/2006 | Buckley et al. | 438/99 |
| 2006/0283539 A1 | 12/2006 | Slafer et al. | |
| 2008/0254555 A1* | 10/2008 | Cok | 438/22 |

FOREIGN PATENT DOCUMENTS

| | | |
|---|---|---|
| WO | 99/54786 | 10/1999 |
| WO | 2006/111766 | 10/2006 |

OTHER PUBLICATIONS

Tang et al., Journal of Applied Physics, 65, 3610 (1989).

* cited by examiner

OLED PATTERNING METHOD

FIELD OF THE INVENTION

The present invention relates to light-emitting devices, and more particularly, to a method for depositing light-emitting materials in a pattern over a substrate.

BACKGROUND OF THE INVENTION

Organic light-emitting diodes (OLEDs) are a promising technology for flat-panel displays and area illumination lamps. The technology relies upon thin-film layers of organic materials coated upon a substrate. OLED devices generally can have two formats known as small molecule devices such as disclosed in U.S. Pat. No. 4,476,292, issued Oct. 9, 1984, by Ham et al., and polymer OLED devices such as disclosed in U.S. Pat. No. 5,247,190, issued Sep. 21, 1993, by Friend et al. Either type of OLED device may include, in sequence, an anode, an organic electroluminescent element (EL), and a cathode. The organic EL element disposed between the anode and the cathode commonly includes an organic hole-transporting layer (HTL), an emissive layer (EML) and an organic electron-transporting layer (ETL). Holes and electrons recombine and emit light in the organic EL layer. Tang et al. (Applied Physics Letter, 51, 913 (1987), Journal of Applied Physics, 65, 3610 (1989), and U.S. Pat. No. 4,769,292, issued Sep. 6, 1988) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes be recombined and result in the emission of light, etc.

A typical OLED device uses a glass substrate, a transparent conducting anode such as indium-tin-oxide (ITO), a stack of organic layers, and a reflective cathode layer. Light generated from such a device may be emitted through the glass substrate. This is commonly referred to as a bottom-emitting device. Alternatively, a device can include a non-transparent substrate, a reflective anode, a stack of organic layers, and a top transparent electrode layer. Light generated from such an alternative device may be emitted through the top transparent electrode. This is commonly referred to as a top-emitting device.

LED devices can employ a variety of light-emitting organic materials patterned over a substrate that emit light of a variety of different frequencies, for example red, green, and blue, to create a full-color display. For small-molecule organic materials, such patterned deposition is done by evaporating materials and is quite difficult, requiring, for example, expensive metal shadow-masks. Each mask is unique to each pattern and device design. These masks are difficult to fabricate and must be cleaned and replaced frequently. Material deposited on the mask in prior manufacturing cycles may flake off and cause particulate contamination. Moreover, aligning shadow-masks with a substrate is problematic and often damages the materials already deposited on the substrate. Further, the masks are subject to thermal expansion during the OLED material deposition process, reducing the deposition precision and limiting the resolution and size at which the pattern may be formed. Polymer LED materials may be deposited in liquid form and patterned using expensive photolithographic techniques.

Alternatively, skilled practitioners employ a combination of emitters, or an unpatterned broad-band emitter, to emit white light together with patterned color filters, for example red, green, and blue, to create a full-color display. The color filters may be located on the substrate, for a bottom-emitter, or on the cover, for a top-emitter. For example, U.S. Pat. No. 6,392,340 entitled "Color Display Apparatus Having Electroluminescence Elements" issued May 21, 2002, by Yoneda et al., illustrates such a device. However, such designs are relatively inefficient since approximately two-thirds of the light emitted may be absorbed by the color filters.

The use of polymer, rather than metal, masks for patterning is known in the prior art. For example, WO2006/111766, published Oct. 26, 2006, by Speakman et al., describes a method of manufacturing comprising applying a mask to substrate; forming a pattern in the mask; processing the substrate according to the pattern; and mechanically removing the mask from the substrate. A method of manufacturing an integrated circuit is also disclosed. However, this method creates significant particulate contamination that can deleteriously affect subsequent processing steps, for example the deposition of materials or encapsulation of a device. Moreover, subsequent location of a mask over a previously patterned area may damage materials in the previously patterned area.

Patterning a flexible substrate within a roll-to-roll manufacturing environment is also known and described in US2006/0283539, published Dec. 21, 2006, by Slafer et al. However, such a method is not readily employed with multiple patterned substrates employing evaporated deposition. Disposable masks are also disclosed in U.S. Pat. No. 5,522,963, issued Jun. 4, 1996, by Anders, Jr. et al., and a process of laminating a mask to a ceramic substrate described. However, the process of registering a mask to the substrate is limited in registration and size. A self-aligned process is described in U.S. Pat. No. 6,703,298, issued Mar. 9, 2004, by Roizin et al., for making memory cells. A sputtered disposable mask is patterned and removed by etching. However, as with the prior-art disclosures cited above, the formation of the mask and its patterning with multiple masking, deposition, and processing steps, are not compatible with delicate, especially organic, materials such as are found in OLED displays.

There is a need, therefore, for an improved method for patterning light-emissive materials that improves resolution and efficiency, reduces damage to underlying layers, reduces particulate contamination, and reduces manufacturing costs.

SUMMARY OF THE INVENTION

The present invention is directed to overcoming one or more of the problems set forth above. Briefly summarized, in accordance with one embodiment of the present invention, the need is met by providing a method of patterning a substrate that includes the steps of:

a) mechanically locating a first masking film over the substrate;

b) segmenting the first masking film into a first masking portion and one or more first opening portions in first locations;

c) mechanically locating a first removal film over the first masking portion and first opening portions;

d) adhering one or more of the first opening portions to the first removal film;

e) mechanically removing the first removal film and one or more of the first opening portions adhered to the first removal film to form one or more first openings in the first masking film; and f) depositing first materials over the substrate through the first openings in the first masking film.

ADVANTAGES

The OLED patterning method of the present invention has the advantage that it improves resolution and efficiency, reduces damage to underlying organic layers, reduces particulate contamination, and reduces manufacturing costs for a patterned light-emitting device.

It will be understood that the figures are not to scale, since the individual components have too great a range of sizes and thicknesses to permit depiction to scale.

DETAILED DESCRIPTION OF THE INVENTION

Figure 1:
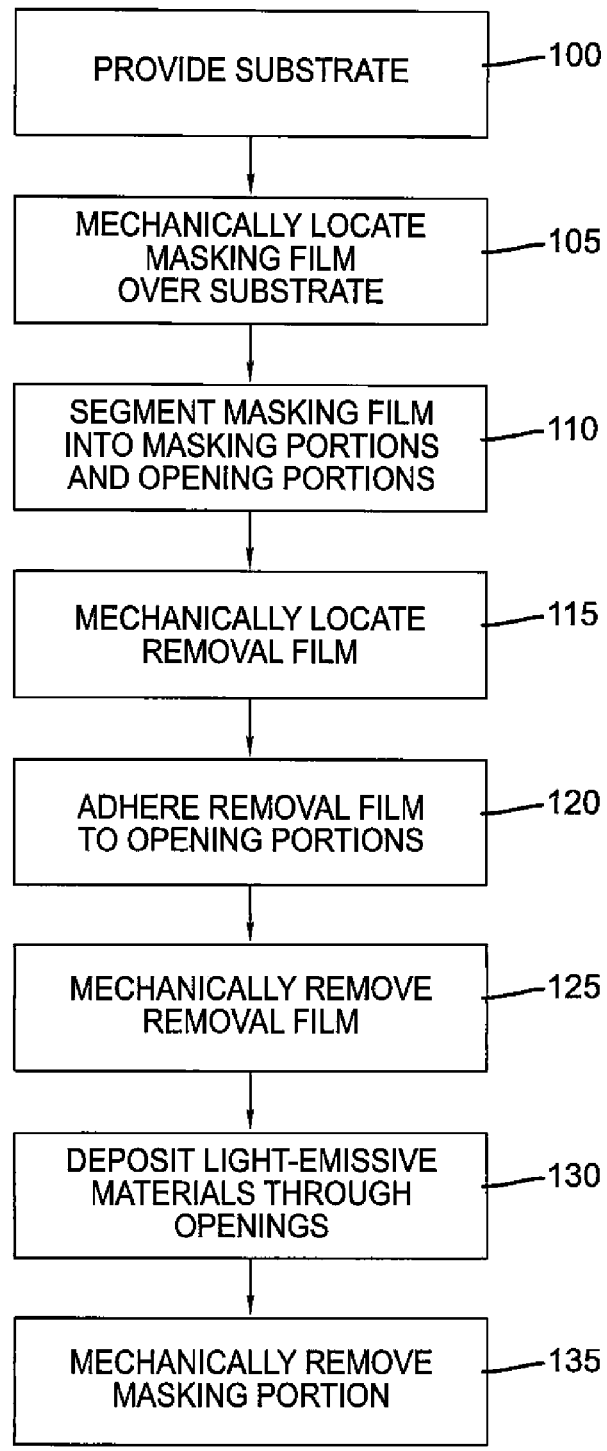
FIG. 1 is a flow chart illustrating a method of forming a patterned, light-emitting device according to one embodiment of the present invention.

Referring to FIG. 1, in accordance with one embodiment of the present invention, a method of forming a patterned, light-emitting device, comprises the steps of providing 100 a substrate; mechanically locating 105 a first masking film over the substrate; segmenting 110 the first masking film into a first masking portion and one or more first opening portions in first locations; mechanically locating 115 a first removal film over the first masking portion and first opening portions; adhering 120 one or more of the first opening portions to the first removal film; mechanically removing 125 the first removal film and one or more of the first opening portions adhered to the first removal film to form one or more first openings in the first masking film; and depositing 130 first materials over the substrate through the first openings in the first masking film. In a further embodiment of the present invention, the first masking portion is removed 135. The first masking portion is the remaining portion of the first masking film after the first masking film has been segmented and the segmented first opening portions removed.

Figure 8:
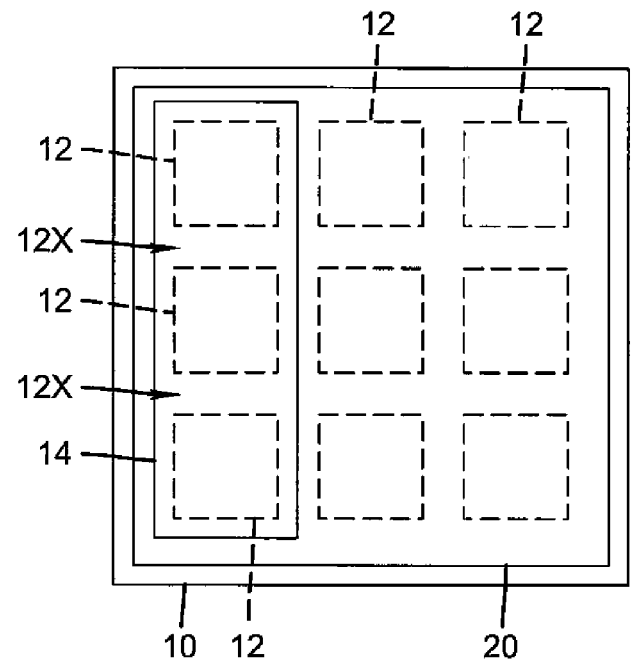
FIG. 8 is a top view of a three-color pixel layout on a substrate made according to an embodiment of the present invention.

The method shown in FIG. 1 may be repeated with a second masking film, second opening portions, second locations, and second light-emissive materials to form a pattern of different light-emissive materials over the substrate. Referring to FIG. 8, a substrate 10 has distinct, non-contiguous light-emitting areas 12 separated by non-light-emitting areas 12X. An opening portion 14 is segmented from a masking film 20 and mechanically removed, forming an opening over some of the light-emitting areas 12 through which light-emissive materials may be deposited to form a column of light-emissive areas on the left side of the substrate 10. The process may be repeated with openings formed over the center column of light-emissive areas 12 and repeated again with the openings formed over the right column of light-emissive areas 12. The first masking film 20 may be segmented in the areas 12X between the light-emitting areas 12 thereby avoiding damage to any other materials that may be present in the light-emitting areas 12.

Figure 2A:
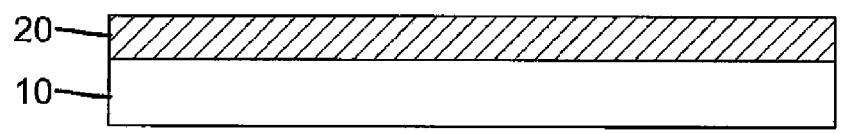
FIGS. 2A-2G illustrate the steps of forming a patterned device according to an exemplary method of the present invention.
Figure 2B:
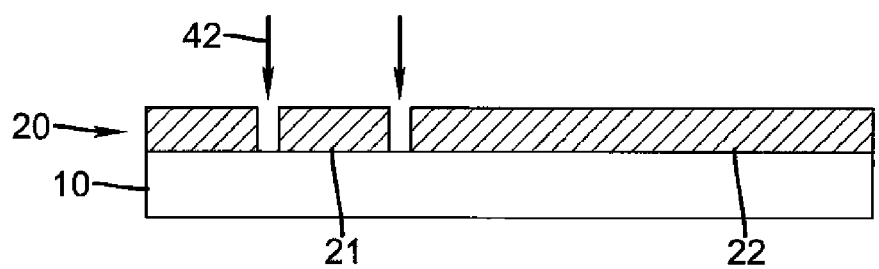
Figure 2C:
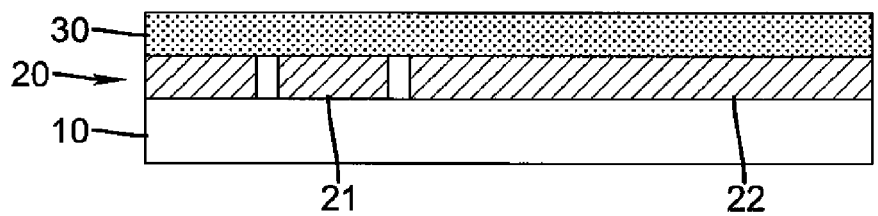
Figure 2D:
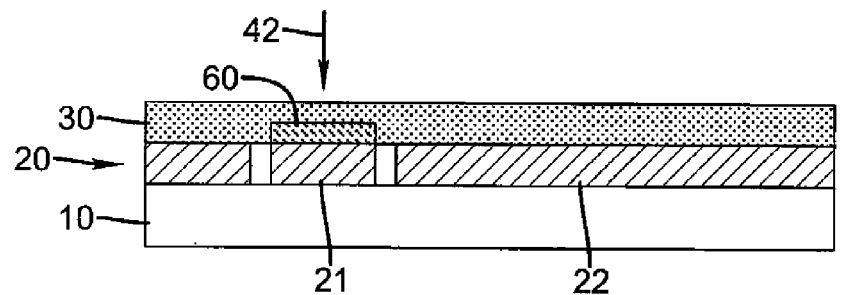
Figure 2E:
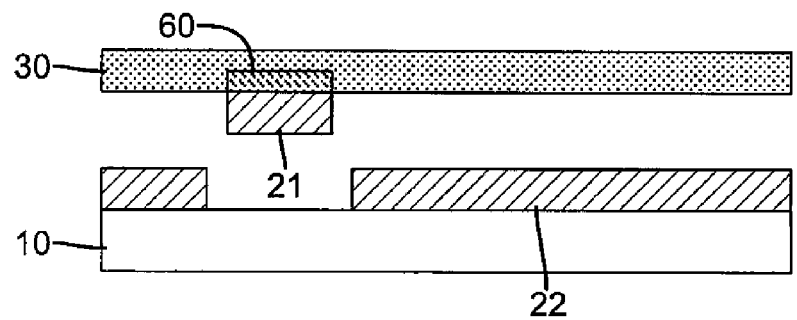
Figure 2F:
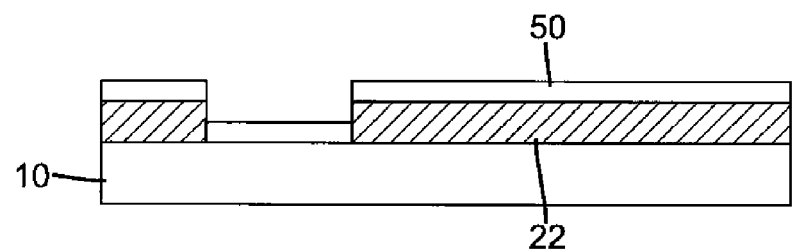
Figure 2G:
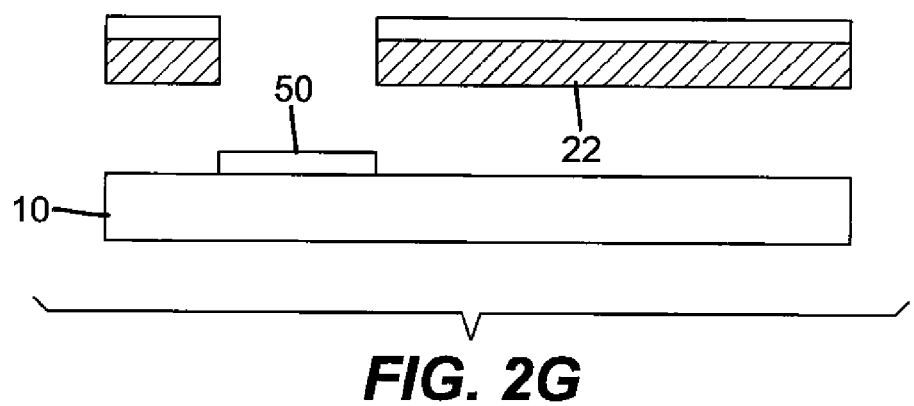

Referring to FIGS. 2A-2F, a masking film 20 is mechanically located over the substrate 10 in a first step illustrated in FIG. 2A. In FIG. 2B, the masking film 20 is segmented by exposure to patterned with light beam 42 (e.g. by ablation via a laser beam), hence forming an opening portion 21 and a masking portion 22. A removal film 30 is then applied over the segmented masking film 20 (FIG. 2C). The removal film 30 has a controllable adhesive 60 (shown in FIG. 2D) located between the removal film 30 and the masking film 20 that is activated by exposure to a patterned light beam 42. A controllable adhesive is an adhesive whose adhesion properties can be changed in response to a stimulus, such as heat or light. In particular, as employed herein, the controllable adhesive 60 may be patterned to form areas of higher or lower adhesion. The controllable adhesive 60 may be conveniently located on the top surface of the masking film 20 opposite the substrate 10. (Alternatively, the removal film 30 or mask film 20 may have a controllable adhesive 60 activated over its entire surface and the patterned light beam 42 deactivates the adhesive 60 in the masking portion 22, not shown.) The opening portion 21 is then adhered to the removal film 30 (FIG. 2D) and the removal film 30 and opening portion 21 are mechanically removed (FIG. 2E). Material 50 may then be deposited over the masking portion 22 and over the exposed portions of the substrate 10. In one embodiment of the present invention, the first masking portion 22 is then removed (FIG. 2G). The process may then be repeated to pattern other locations of the substrate 10 as described with reference to FIG. 8 above.

Figure 3A:
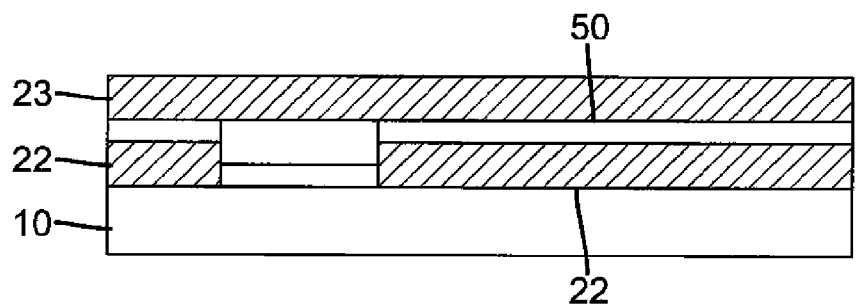
FIGS. 3A-3F illustrate the steps of forming a patterned device according to another method of the present invention.
Figure 3B:
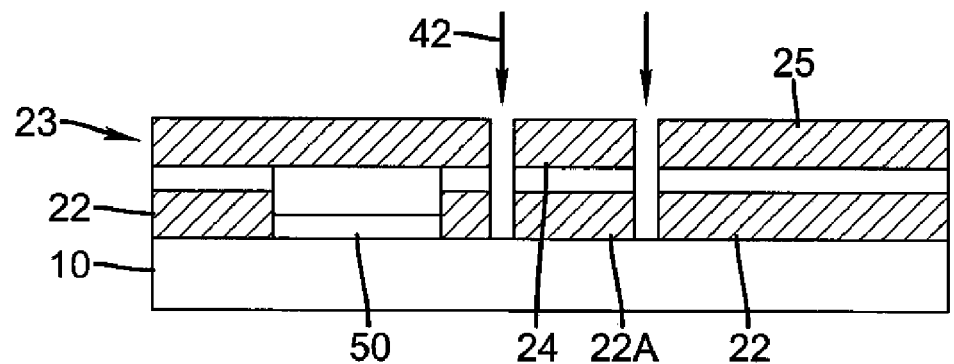
Figure 3C:
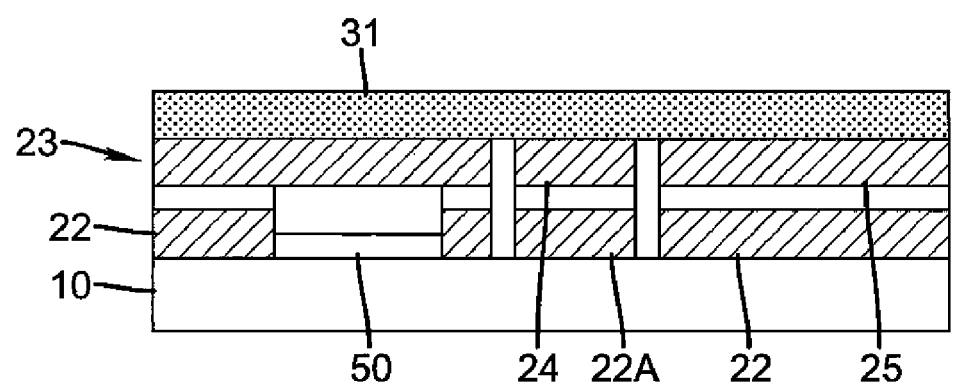
Figure 3D:
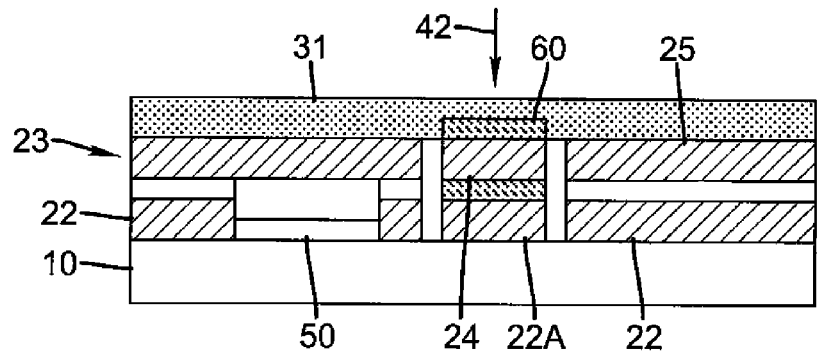
Figure 3E:
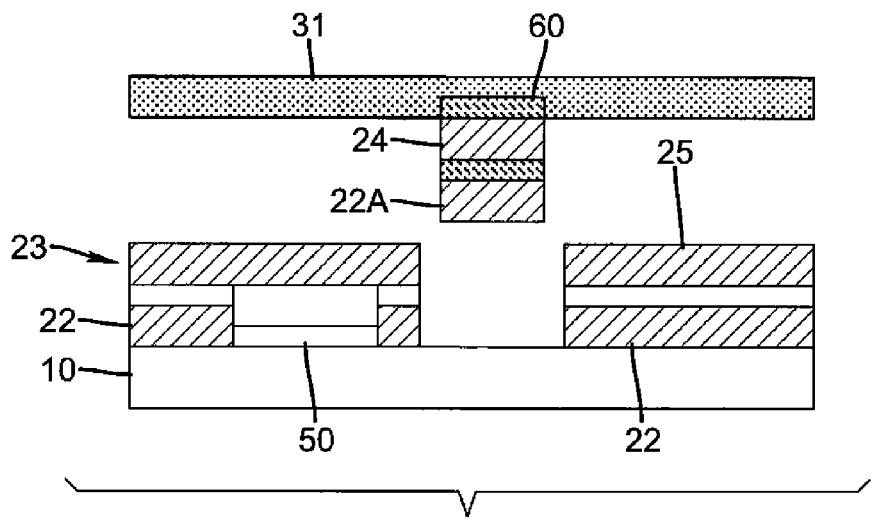
Figure 3F:
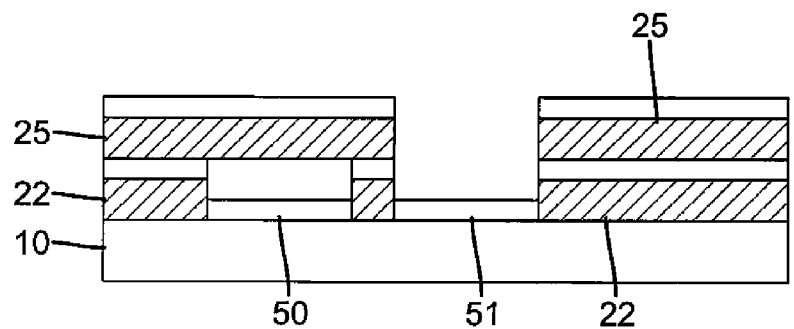

In an alternative embodiment of the present invention illustrated in FIG. 3A, a second masking film 23 is applied before the first masking portion 22 is removed (FIG. 2G). Patterning light beam 42 is then employed to segment masking film 23 into opening portion 24 and masking portion 25 (FIG. 3B). The patterning light beam 42 segments both the masking film 23 and the remaining mask portion 22A. A second removal film 31 is then mechanically located over the second masking film 23 (FIG. 3C) and patterning light beam 42 employed to activate controllable adhesive 60 between the masking film 31 and the opening portion 24 and remaining mask portion 22A (FIG. 3D). Referring to FIG. 3E, the masking film 31 is mechanically removed together with opening portion 24 and remaining mask portion 22A. Material 51 may then be deposited over the masking portion 25 and in the substrate 10 openings.

Figure 4A:
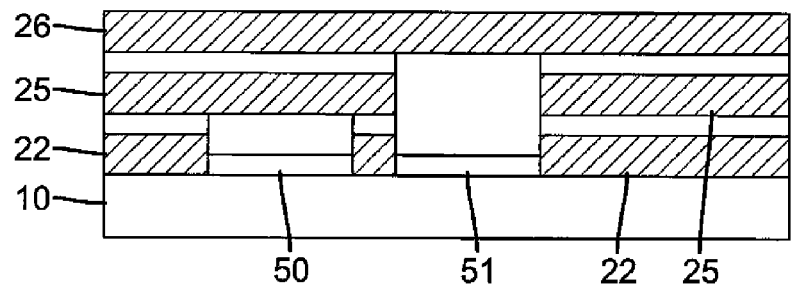
FIGS. 4A-4G illustrate the steps of forming a patterned device according to an alternative method of the present invention.
Figure 4B:
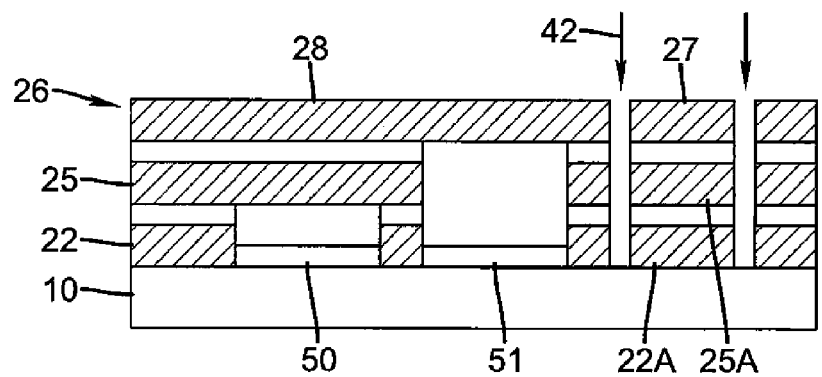
Figure 4C:
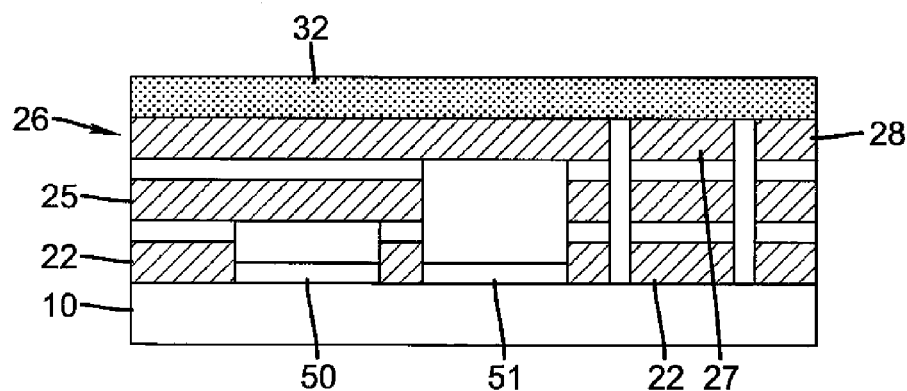
Figure 4D:
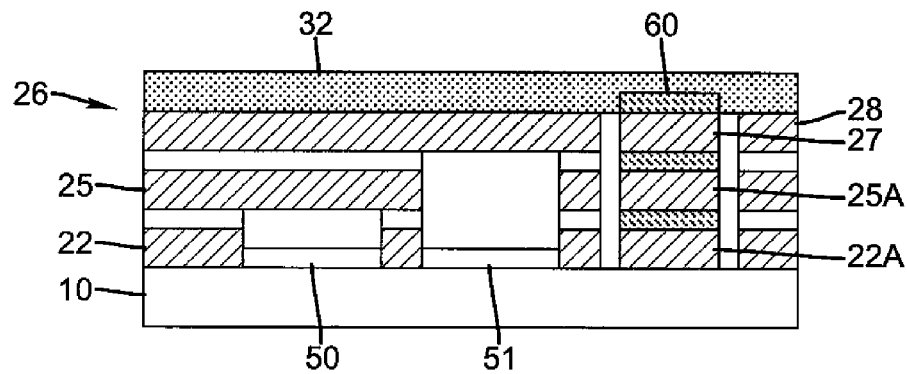
Figure 4E:
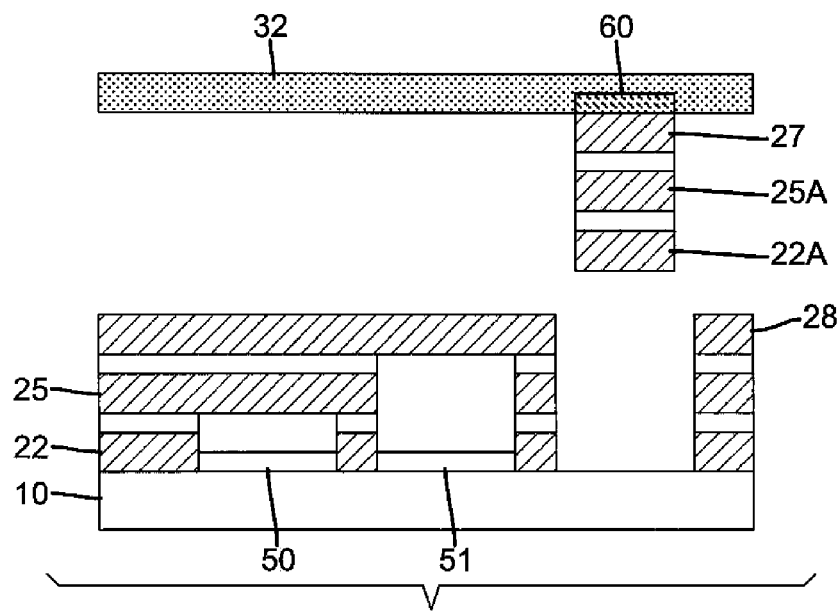
Figure 4F:
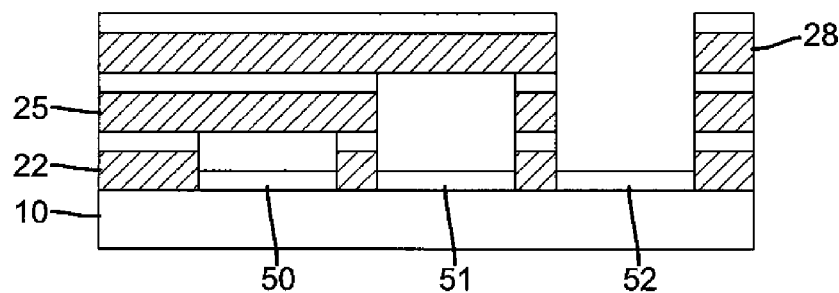
Figure 4G:
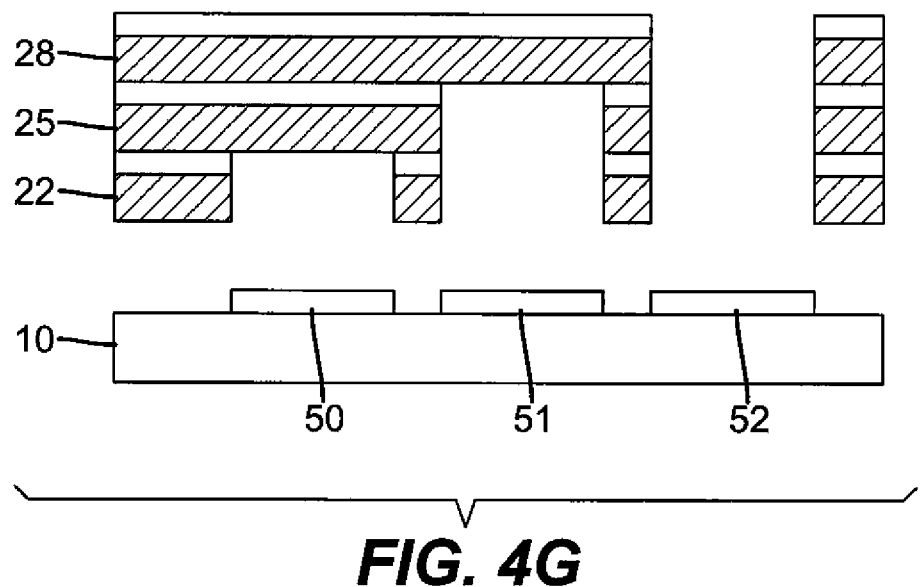

Referring to FIGS. 4A-4F, the process may then be repeated to pattern other locations of the substrate 10 as described with earlier reference to FIG. 8 above. A masking film 26 may be mechanically located over the materials 51 (FIG. 4A) and patterned with light beam 42 to segment the masking film 26 into an opening portion 27 and masking portion 28 (FIG. 4B). A removal film 32 is located over the masking film 26 (FIG. 4C) and a controllable adhesive 60 activated (FIG. 4D) to adhere masking film portions 22A, 25A, and opening portion 27 to removal film 32 that is then removed (FIG. 4E) and a material 52 deposited (FIG. 4F) over the masking portion 28 and substrate 10. Referring to FIG. 4G, the masking portions 22, 25, and 28 may then be removed; leaving a substrate 10 patterned with materials 50, 51, 52 e.g., light-emissive. The materials 50, 51, and 52 may be different light-emissive materials to form a patterned light-emitting device.

Figure 5A:
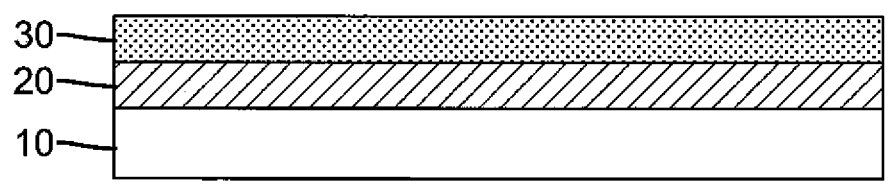
FIGS. 5A-5C illustrate the steps of forming a patterned device according to yet another method of the present invention.
Figure 5B:
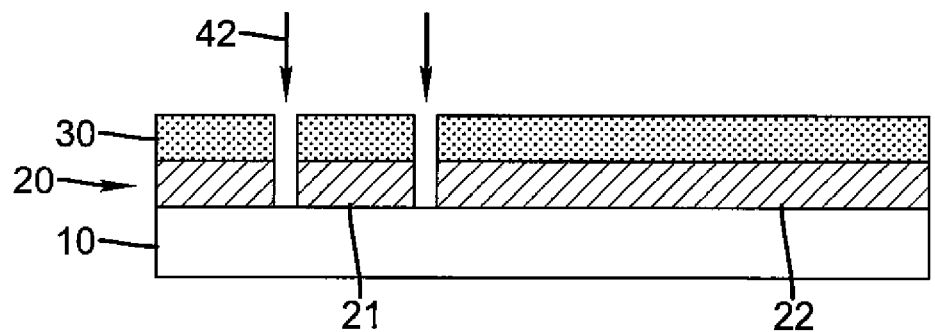
Figure 5C:
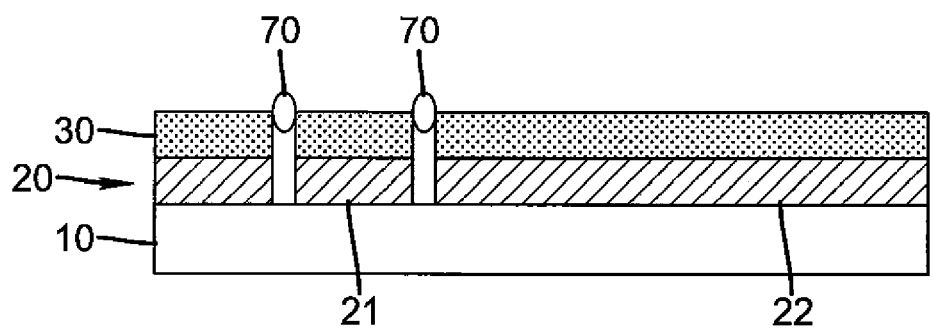

Referring to FIG. 5A, in another embodiment of the present invention, the removal film 30 may be mechanically located in a single, common step with the masking film 20, at the same time, thereby reducing manufacturing costs. As shown in FIG. 5B, both the removal film 30 and masking film 20 are then patterned together with the patterned light beam 42 to segment the masking film 20 into an opening portion 21 and a masking portion 22 in a common step, at the same time. The segmented portions of the removal film 30 are then reattached (FIG. 5C), for example, by melting the edges of the film or by applying an adhesive to the layer as illustrated with attachments 70. The removal film 30 and opening portion 21 may then be removed as illustrated in FIGS. 2D-2F.

Figure 6A:
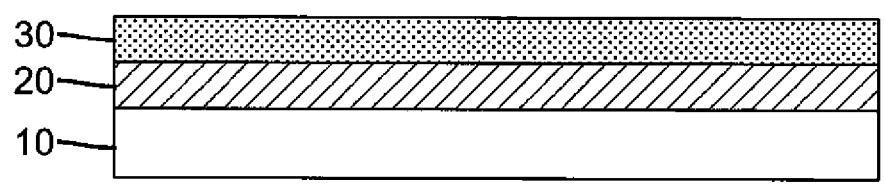
FIGS. 6A-6C illustrate the steps of forming a patterned device according to a method of the present invention.
Figure 6B:
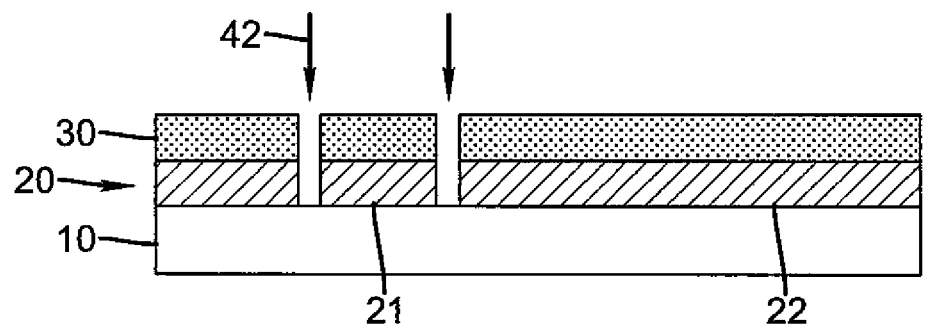
Figure 6C:
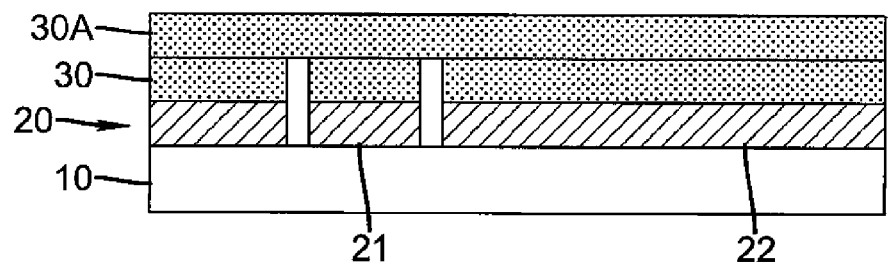

Referring to FIG. 6A, in another embodiment of the present invention, the removal film 30 may be mechanically located in a single step with the masking film 20, thereby reducing manufacturing costs. As shown in FIG. 6B, both the removal film 30 and masking film 20 are then patterned together with the patterned light beam 42 to segment the masking film 20 into an opening portion 21 and a masking portion 22. A second removal film 30A may then be adhered to removal film 30 (FIG. 6B) and then removed together with the removal film 30 as shown in FIGS. 2D-2F. The second removal film 30A need not be patterned or aligned.

Figure 7:
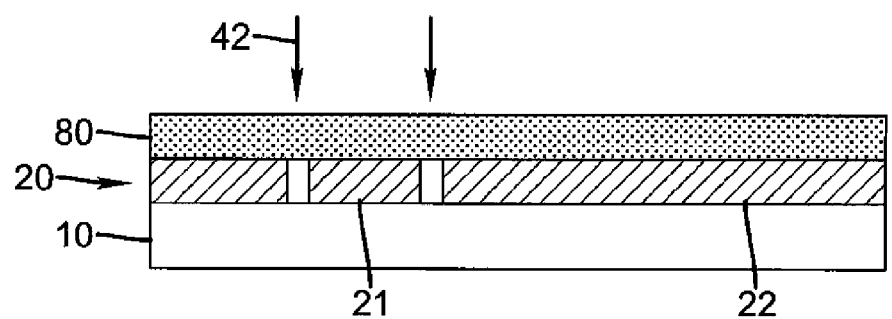
FIG. 7 illustrates a step of forming a patterned device according to a method of the present invention.

In yet another embodiment of the present invention illustrated in FIG. 7, the removal film 34 is transparent so that it may be mechanically located in a single step with the masking film 20, thereby saving manufacturing costs, and the masking film 20 segmented into opening portion 21 and masking portion 22 by ablating the masking film 20 with patterned light beam 42 that passes through the transparent removal film 34 so that no reattachment or second removal film is necessary.

Laser ablation techniques, film, adhesives, controllable adhesives, and mechanical attachment and mechanical detachment techniques are all known in the art, as are light-emitting materials (organic, polymer, or inorganic) and other layers such as charge-control layers, electrodes, and thin-film electronic devices suitable for the control of flat-panel display or illumination devices.

Figure 9:
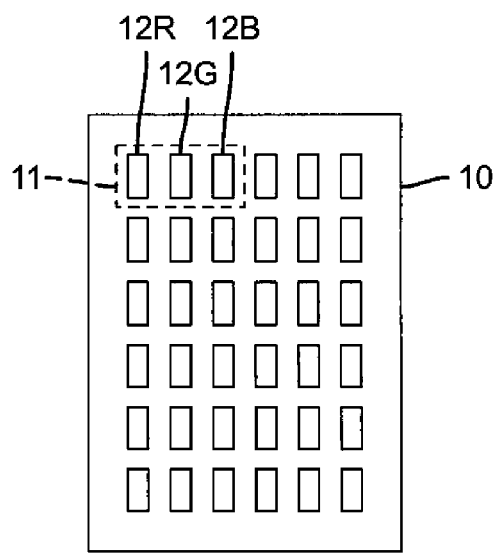
FIG. 9 is a top view of a three-color pixel layout on a substrate according to the prior art.

Referring to FIG. 9, in a prior-art design, pixels 11 may comprise three patterned light-emitting elements or sub-pixels 12R, 12G, 12B; each patterned light-emitting element emitting light of a different color; for example, red, green, and blue, to form a full-color display. In other designs, four-color pixels are employed, for example, including a fourth white, yellow, or cyan light-emitting element. The present invention includes any patterned light-emitting device, regardless of design, layout, or number of light-emitting elements or colors of light-emitting elements and specifically includes displays having red, green, and blue sub-pixels and displays having red, green, blue, and white sub-pixels. As shown in FIG. 9, the light-emitting elements 12R, 12G, 12B are arranged in a stripe configuration such that each color of light-emitting element forms a column of light-emitting elements emitting the same color of light. In other designs, the light-emitting elements are arranged in delta patterns in which common colors are offset from each other, from one row to the next row. Alternatively, four-element pixels may be arranged in two-by-two groups of four light-emitting elements. All of these different designs and layouts are contemplated in the present invention.

As taught in the prior art, for example, in manufacturing OLED devices, deposition masks may be made of metal and are reused multiple times for depositing evaporated organic materials. The masks may be cleaned, but are in any event, expensive, subject to thermal expansion, difficult to align, problematic to clean, and eventually wear out. In particular, the present invention does not employ photolithographic methods of liquid coating, drying, patterned exposure forming cured and uncured areas, followed by a liquid chemical removal of the cured or uncured areas to form a pattern. In contrast, the present invention provides a very low-cost, single-use mask that is patterned while in place over the substrate, thereby overcoming the limitations of the prior art. The mask may be formed of flexible thin films of, for example, polymers, either transparent or non-transparent and is patterned without liquid chemicals.

Figure 10C:
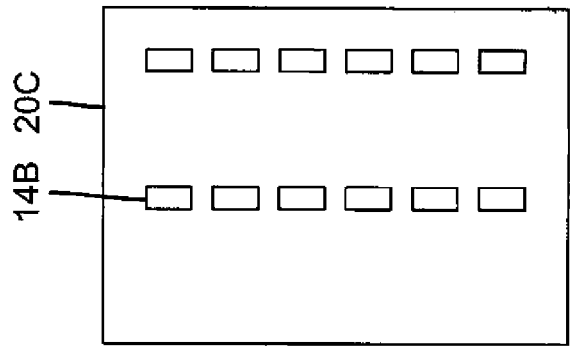
FIGS. 10A-10C are top views of three different mask portions for depositing different materials on a substrate useful for the present invention.
Figure 10B:
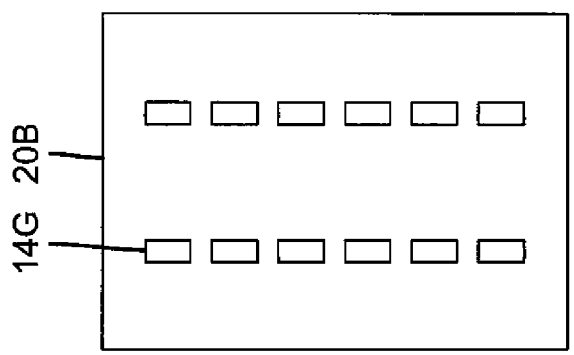
Figure 10A:
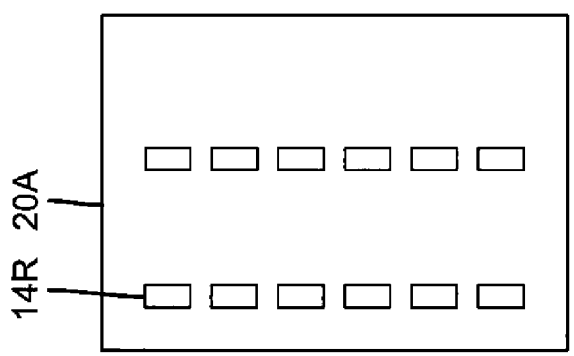

Referring to FIGS. 10A, 10B, and 10C, in one embodiment of the method of the present invention, three masking films are successively employed. Each mask has openings in different locations that are referred to as "mask holes". Throughout this application "mask holes" and "opening portions" in the masking film are used interchangeably. Three different types of material are deposited through mask holes 14R, 14G, 14B in three different sets of locations corresponding to the light-emitting element locations 12R, 12G, and 12B in the layout of FIG. 9. In this embodiment, a first masking film 20A is firstly located over the substrate and the material in the patterned mask holes 14R in the masking film 20A is removed employing one of the methods described above. Light-emitting material is then deposited through the mask holes 14R onto the corresponding substrate's light-emitting element locations 12R; the first masking film 20A is subsequently removed. In a second series of steps, a second masking film 20B is secondly located over the substrate and the material in the patterned mask holes 14G in the masking film 20B is removed. Light-emitting material is then deposited through the openings 14G onto the corresponding substrate light-emitting element locations 12G and the second masking film 20B subsequently removed. The pattern in the first and second films may be different to expose different light-emitting areas. In a third series of steps, a third masking film 20C is thirdly located over the substrate and the material in the mask holes 14B in the masking film 20C is removed. Light-emitting material is then deposited through the mask holes 14B in yet another different pattern onto the corresponding substrate light-emitting element locations 12B and the third masking film 20C subsequently removed. At this stage, three different materials are patterned in three different sets of light-emitting element locations 12R, 12G, and 12B over the substrate to form a plurality of full-color light-emitting pixels. Any remaining processing steps necessary to form a complete device may then be performed. For example, an OLED device using patterned OLED materials may be employed in either a top- or bottom-emitter configuration. Note that the present invention may be combined with the unpatterned deposition of other layers to form a complete light-emitting device. Such unpatterned materials may include charge-injection layers, and charge-transport layers as are known in the organic and inorganic LED arts. Moreover, the areas of the mask holes 14 may be larger than the light-emitting areas 12. Since the light-emitting area 12 is typically defined by patterned device electrodes (not shown), it is only necessary to deposit material over the electrode areas corresponding to light-emitting elements 12. Additional material may be deposited elsewhere to ensure that deposition tolerances are maintained.

Figure 11:
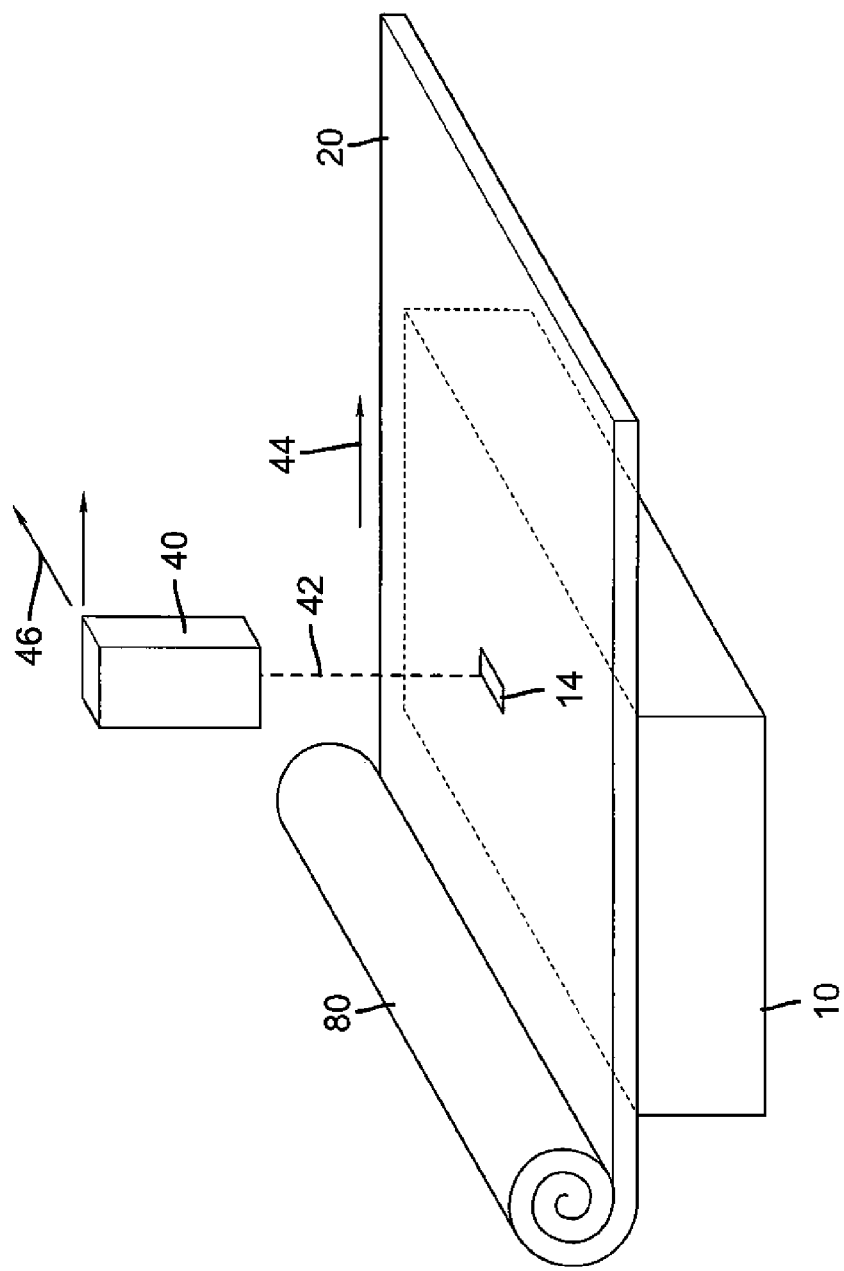
FIG. 11 is a perspective of a mask film roll, masking film, material ablation device, and substrate useful for the present invention.

Referring to FIG. 11, a laser 40 emitting laser light beam 42 ablates the masking film material in the perimeter of the opening portions 14 in masking film 20 over substrate 10 to segment the opening portions 14. The laser light (or laser) is moved in orthogonal directions 44 and 46 to scan around the perimeter of the mask hole 14 and thereby ablate material to segment mask hole 14. Alternatively, the substrate may be moved in one direction while the laser beam 42 scans in the orthogonal direction, thereby enabling a continuous process. The masking film 20 may be dispensed from a roll 80 of masking film material and located over the substrate 10. Likewise, when the masking portion is mechanically removed, the material may be picked up on a second roller (not shown) as new masking film material is advanced from the roll 80. Rolls of films, mechanisms for moving and locating the films over a substrate, lasers, and mechanisms for scanning lasers over a surface are all well-known in the art.

Figure 12:
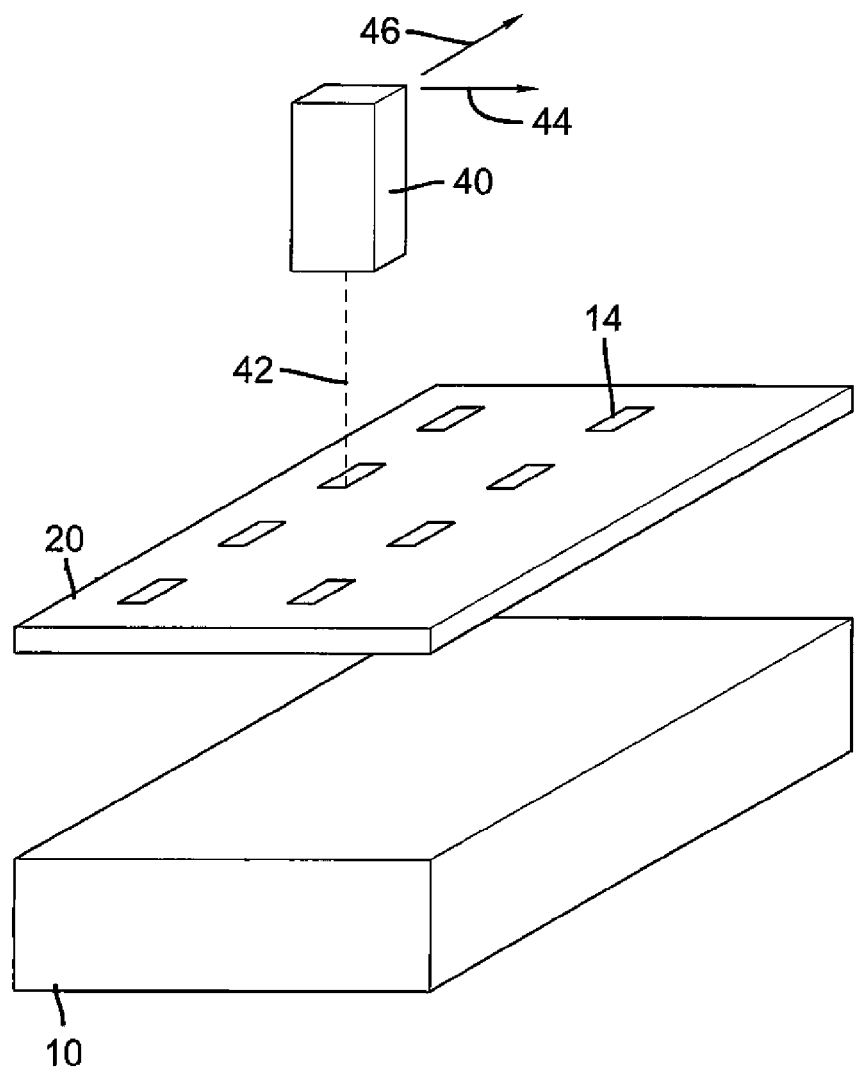
FIG. 12 is a perspective of a mask film, material ablation device, and substrate useful for the present invention.
Figure 13:
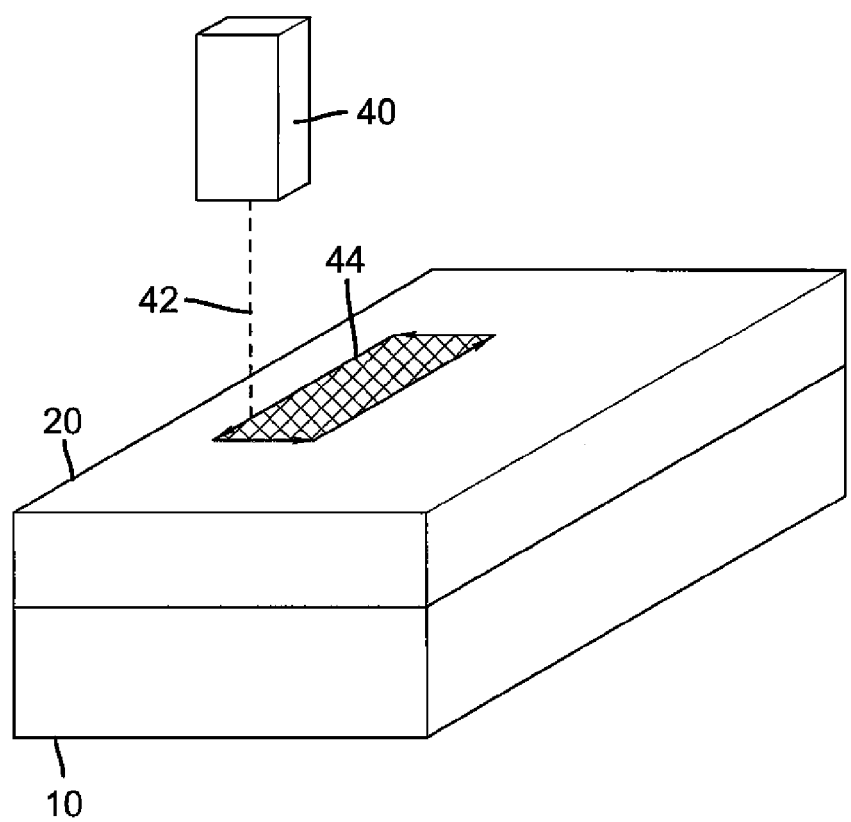
FIG. 13 is a perspective of a mask film, material ablation device, and substrate useful for the present invention.
Figure 14:
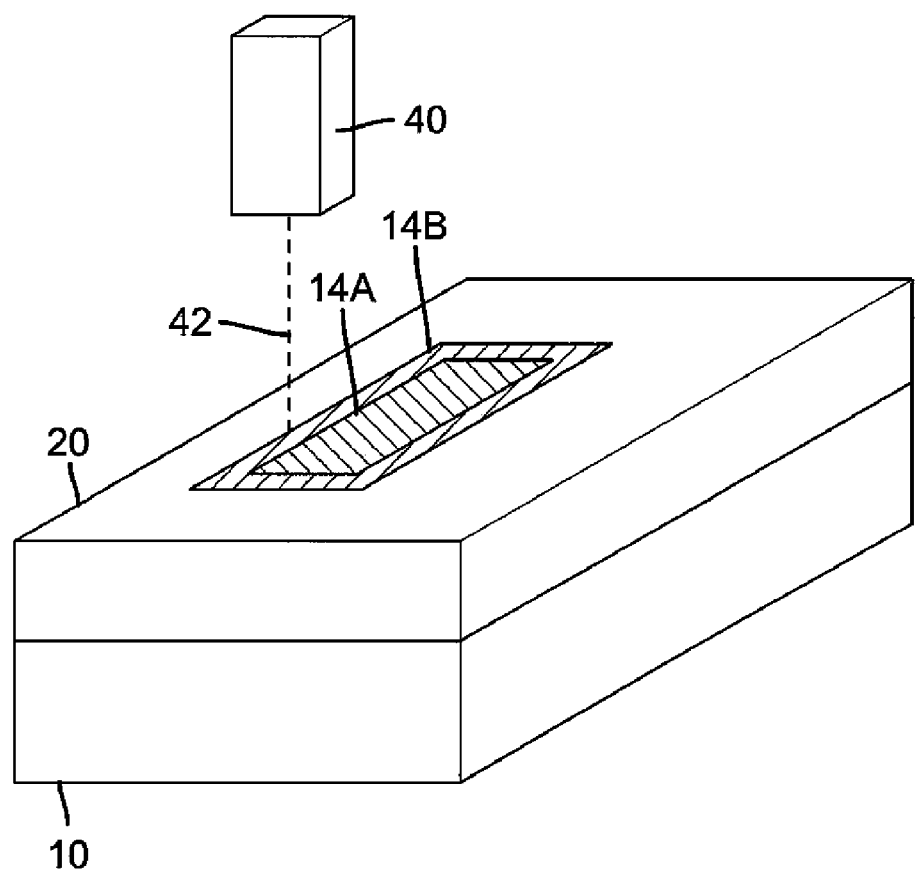
FIG. 14 is a perspective of a mask film, material ablation device, and substrate useful for the present invention.

FIG. 12 illustrates a more detailed exploded perspective including the laser 40, light beam 42, the orthogonal scan directions 44 and 46, the masking film 20 over the substrate 10, and a plurality of mask holes 14. FIG. 12 similarly illustrates the movement of the light beam 42 over the surface of the masking film 20 and the substrate 10 in orthogonal directions 44 and 46 to segment mask hole 14. FIG. 13 illustrates with arrows the relative movement of the light beam 42 and the masking film 20 to segment the opening portion 14. Referring to FIG. 14, the laser 40 scans light beam 42 around the perimeter 14b of the mask hole 14a so that the masking film material in the interior of the mask hole 14a is detached from the masking film 20. The segmented masking film material is then mechanically removed, leaving the mask hole opening 14a free for subsequent deposition of light-emitting material.

While the masking film 20 itself need not be registered with the light-emitting areas 12 on the substrate 10, the mask hole openings 14 may correspond with the light emitting areas 12 and also be registered with them. Such registration may be aided by providing, for example, fiducial marks on the substrate. Such marks and the mechanisms for scanning lasers and ablating material to a necessary tolerance are known in the art, as are devices for collecting ablated material. Typical mask hole openings may be, for example, 40 microns by 100 microns in size.

Figure 15:
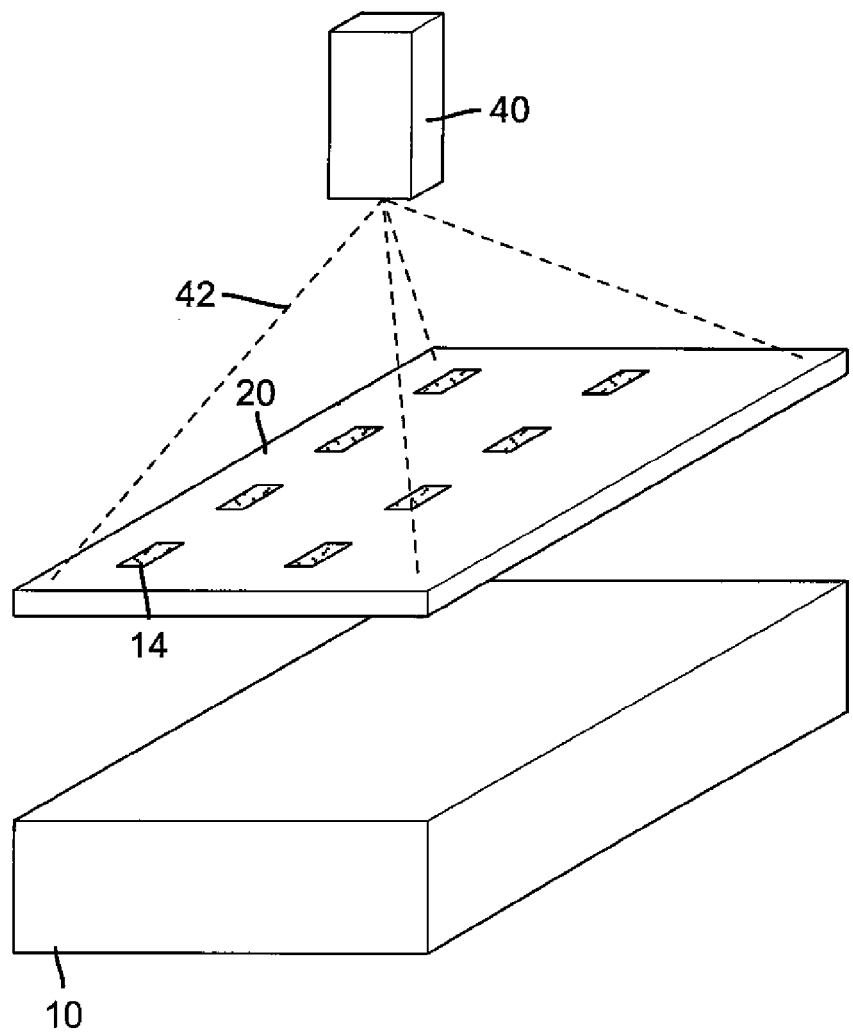
FIG. 15 is a perspective of a mask film, material ablation device, and substrate useful for the present invention.

While FIGS. 11-14 illustrate embodiments in which a laser beam 42 is scanned over the masking film 20 to segment masking portions from mask hole openings 14, FIG. 15 illustrates an alternative approach. Referring to FIG. 15, the masking film 20 includes light absorptive areas adapted to selectively absorb laser light so that ablation only occurs in the light-absorptive areas. Light-absorptive areas, in the locations of the mask hole openings 14 perimeter, may be formed by printing light-absorbing materials on the masking film, for example by inkjet or gravure processes, before or after the masking film 20 is located over the substrate 10. The light-absorptive areas correspond to the perimeter of the masking holes 14. In this way, the entire masking film 20 (or portions thereof) may be exposed at one time to ablate material in the light-absorptive areas, thereby increasing the amount of material that may be ablated in a time period and decreasing the amount of time necessary to form the mask hole openings 14 in the masking film 20.

Figure 16:
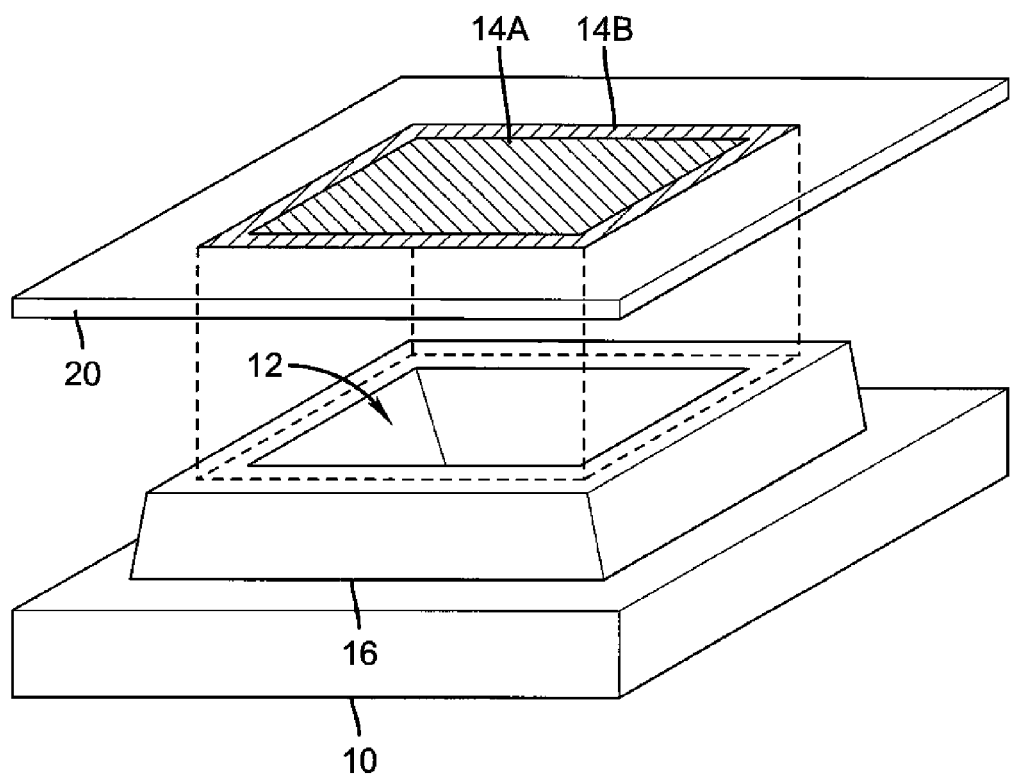
FIG. 16 is a perspective of a patterned mask film located over a substrate having raised areas, and a pressure chamber having holes useful for the present invention.

Referring to FIG. 16, in a further embodiment of the present invention, raised areas 16 may be formed over the substrate 10. Such raised areas can comprise, for example, photolithographic materials such as photo-resist or silicon dioxides or silicon nitrides formed on the substrate through photolithographic processes and may be, for example, 20 microns to 50 microns wide, depending on the tolerances of the processes used to pattern the substrate electrodes or thin-film electronic components. The raised areas 16 may be located around a light-emitting area 12 and may be employed to insulate electrodes formed over the substrate 10. Such processes are well known in the photolithographic art and have been employed in OLED devices. The masking film 20 may be located over the substrate 10 and in contact with the raised areas 16. Laser ablation may be performed to segment the mask hole 14 by ablating masking film material in the perimeter 14b of the mask hole 14. The remaining opening portion 14a is then mechanically removed as described above. By employing a raised area 16, the masking film 20 is prevented from contacting the substrate 16 and any pre-existing layers located in the light-emitting areas 12.

As shown in FIG. 16, the mask hole perimeter 14b is located over the raised areas 16 (as shown by the dashed lines). In this embodiment, the light beam 42 is not directed into the light-emitting element area 12, thereby avoiding any problems that might result from exposing existing layers of material that may be already present in the light-emitting areas 12 (for example, inadvertent ablation of pre-deposited organic materials). Note that the area of the mask hole 14 may be larger than the light-emitting area 12

In further embodiments of the present invention, the masking film 20 may be coated with a light adhesive on one or both sides of the masking film to assist in locating and maintaining the masking film 20 in registration with the substrate 10 and light-emitting areas 12. The adhesive may be located on the side of the masking film 20 that is in contact with the substrate 10 or raised areas 16. The adhesive may prevent, for example, the masking film 20 from moving with respect to the substrate 10 and may also serve to prevent ablated masking film material from moving or falling into the light-emitting area 12, thus improving the portion removal process.

Figure 17:
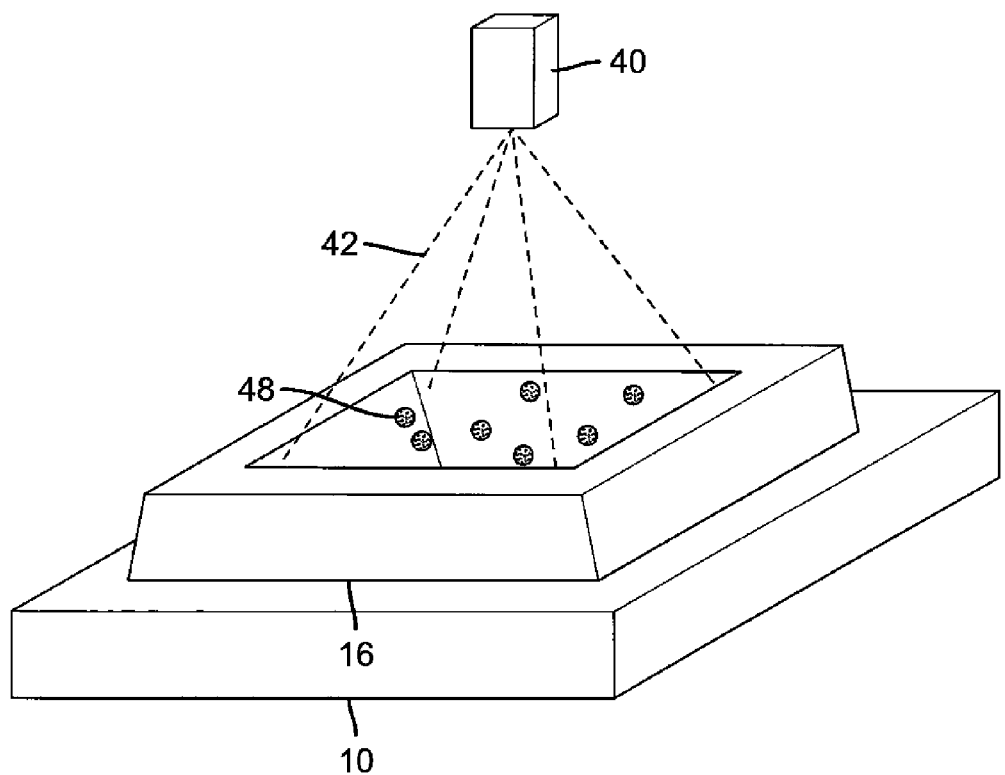
FIG. 17 is a perspective of contaminating particles within a light-emitting area, and an ablation device useful for the present invention.

Referring to FIG. 17, particulate contamination 48 deposited in the light-emitting areas 12 within a raised area 16 may be ablated as well, for example by a laser. Other cleaning methods may also be employed, for example, chemical or mechanical cleaning, depending on the nature of any other desired materials present.

Figure 18:
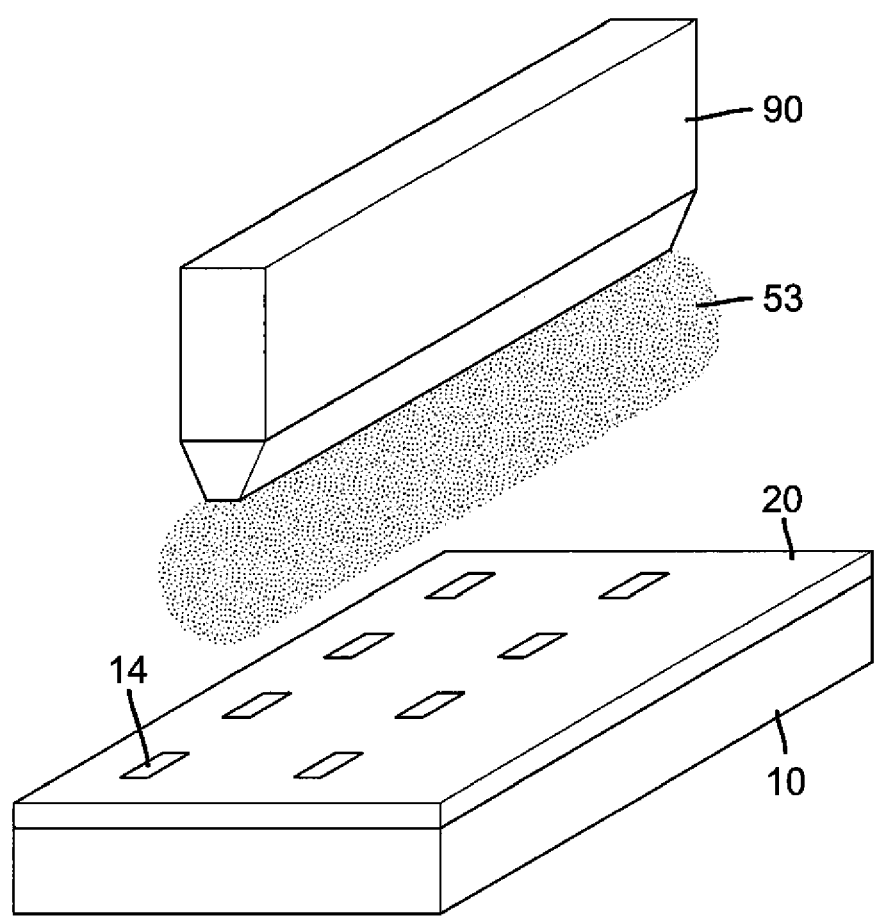
FIG. 18 is a perspective of a deposition system, materials, and substrate useful for the present invention.

Referring to FIG. 18, once the mask hole openings 14 are formed in the masking film 20 in alignment with the light-emitting areas 12, light-emitting materials may be applied. In the case of small molecule OLED devices, the light-emitting materials are typically deposited by evaporation in a vacuum from a source, for example, a linear source 90 that forms a plume of organic material 53 that is deposited through the mask holes 14 onto the substrate 10 in the locations of the light-emitters 12.

In summary, the method of the present invention may be employed to form, for example, a patterned, light-emitting device, comprising a substrate, light-emitting areas located over the substrate, and light-emitting materials pattern-wise deposited in the light-emitting areas through a masking film mechanically located over the substrate, the masking film having patterned openings formed while the masking film is located over the substrate and mechanically removed after the light-emitting materials are deposited. Hence, according to various embodiments of the present invention, a patterned, light-emitting device may be formed by first patterning the substrate with electrodes, active-matrix components, and the like, as is known in the display art. One or more unpatterned layers may also be deposited over the substrate. These steps may be performed in a vacuum. Subsequently, the substrate may be located in a masking chamber having an atmosphere, for example a nitrogen atmosphere. The first masking film is located over the substrate, the surface is used to adhere the masking film over the substrate, the mask holes are formed for a first pattern of light-emitting elements that emit a common color of light by segmenting the first masking film into opening portions and a masking portion and then mechanically removing the opening portions. The substrate may be detached from a masking film dispensing mechanism and removed from the masking chamber to a vacuum chamber and light-emitting materials deposited through the mask holes, for example by employing a linear source to deposit organic LED materials. The substrate is then returned to a masking chamber and the masking film removed. A second masking film is similarly provided and adhered and a second pattern of mask holes is formed. A third masking process proceeds likewise, resulting in a three-color light-emitting device. Any final un-patterned layers, for example an unpatterned electrode, may be applied and the device encapsulated.

The present invention provides many improvements over the prior art. The masking film may be inexpensive, for example comprising PEN or PET or other low-cost polymers provided in rolls. The film does not have to be repeatedly aligned with the substrate, as do traditional metal masks, nor do temperature dependencies arise, since the materials do not necessarily expand significantly in response to temperature; and if significant thermal expansion were to occur, the heat would only slightly decrease the area of the masking holes. If the masking holes are slightly oversized (as would be the case if a perimeter was ablated over a raised area), no effect on the formation of the light-emitting element would result. Because the film covers all of the substrate except those areas to be patterned with light-emitting materials, the substrate is protected from particulate contamination. Moreover, because a new film is provided for each deposition cycle, particulate contamination formed by removing masking film material may be removed when the masking film is mechanically removed. Employing a raised area around the light-emitting areas likewise prevents damage to any pre-existing light-emitting areas, as does ablating a perimeter over the raised areas around mask holes. In any case, the masking film may be sufficiently thin that touching any delicate layers of, for example, organic materials, on the substrate may not damage the layers.

The present invention also provides a scalable means for manufacturing patterned light-emitting devices, since the masking film can be readily made in large sizes. Laser systems useful for ablating masking film materials may comprise many separate lasers, therefore enabling fast patterning. Such laser systems are known in the art. The present invention can be employed in continuous processing systems, since the time-consuming steps (such as the mask hole formation) may be done in a continuous process while the provision and removal of the masking film requires relatively little time.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture. Inorganic light-emissive materials may also be employed.

The invention has been described in detail with particular reference to certain preferred embodiments thereof, but it will be understood that variations and modifications can be effected within the spirit and scope of the invention.

PARTS LIST 10 substrate
11 pixel
12 light-emitting element or area
12R red light-emitting element
12G green light-emitting element
12B blue light-emitting element
12X area between light-emitting elements
14 opening portion or mask hole
14R opening in masking film for red light-emitter
14G opening in masking film for green light-emitter
14B opening in masking film for blue light-emitter
14a mask hole material within perimeter of mask hole
14b mask hole perimeter
16 raised area
20, 20A, 20B, 20C masking film
21 opening portion
22, 22A masking portion
23 masking film
24 opening portion
25, 25A masking portion
26 masking film
27 opening portion 28 masking portion
30, 31, 32 removal film
30A second removal film
34 transparent removal film
40 laser
42 light beam
44, 46 direction
48 contaminating particles
50, 51, 52 material
60 controllable adhesive
53 plume of evaporated particles
70 attachment
80 roll of masking film
90 linear source
100 provide substrate step
105 locate masking film step
110 segment openings step
115 locate removal film step
120 adhere removal film to opening portions step
125 remove removal film step
130 deposit light-emitting materials step
135 remove masking portion step

The invention claimed is:

1. A method of patterning a substrate, comprising the sequential steps of:
  a) providing a pre-formed first masking film and a pre-formed first removal film;
  b) physically locating the pre-formed first masking film over the substrate;
  c) segmenting the located pre-formed first masking film into a first masking portion and one or more first opening portions in first locations and physically locating the pre-formed first removal film over the first masking portion and first opening portions;
  d) adhering one or more of the first opening portions to the located pre-formed first removal film;
  e) picking up and removing the located pre-formed first removal film and one or more of the first opening portions adhered to the located pre-formed first removal film to form one or more first openings in the located pre-formed first masking film; and
  f) depositing first materials over the substrate through the first openings in the located pre-formed first masking film;
  g) providing a pre-formed second masking film and then physically locating the pre-formed second masking film over the located pre-formed first masking film and first openings, wherein the pre-formed second masking film is not formed inside the first openings;
  h) segmenting the located pre-formed second masking film into a second masking portion and one or more second opening portions in second locations and physically locating a pre-formed second removal film over the second masking portion and second opening portions;
  i) adhering one or more of the second opening portions to the located pre-formed second removal film;
  j) picking up and removing the located pre-formed second removal film and one or more of the second opening portions adhered to the located pre-formed second removal film to form one or more second openings in the located pre-formed second masking film; and
  k) depositing second materials over the substrate through the second openings in the located pre-formed second masking film;
  l) picking up and removing the first masking portion and second masking portion.

2. The method of claim 1, further comprising the steps of picking un and removing the located pre-formed first masking film after the second materials are deposited.

3. The method of claim 1, wherein at least some of the first locations we different from the second locations.

4. The method of claim 1, wherein the materials we light-emissive materials.

5. The method of claim 1, wherein a pattern-wise controllable adhesive layer is formed on either the pre-formed first masking film or the pre-formed first removal film.

6. The method of claim 1, wherein one of the first opening portions covers a plurality of distinct, non-contiguous, light-emitting areas located over the substrate.

7. The method of claim 6, further comprising the step of segmenting the located pre-formed first masking film in the areas between the light-emitting areas.

8. The method of claim 6, further comprising the step of forming raised areas between the light-emitting areas before the pre-formed first masking film is located over the substrate.

9. The method of claim 1, wherein both the pre-formed first masking film and the pre-formed first removal film are physically located over the substrate together at the same time.

10. The method of claim 1, wherein both the located pre-formed first masking film and the located pre-formed first removal film are segmented at the same time.

11. The method of claim 10, further comprising the step of reattaching the segmented portions of the located pre-formed first removal film.

12. The method of claim 10, further comprising the step of adhering a pre-formed second removal film to the located pre-formed first removal film and picking up and removing the pre-formed second removal film, the located pre-formed first removal film, and the first opening portions at the same time.

13. The method of claim 1, wherein the side of the pre-formed first removal film opposite the substrate is adhesive.

14. The method of claim 1, wherein the pre-formed first removal film is transparent.

15. The method of claim 14, wherein the located pre-formed first masking film is segmented by exposure to laser light through the transparent located pre-formed first removal film.

16. The method of claim 5, wherein the pattern-wise controllable adhesive layer is controlled by exposure to a first frequency of light and the pre-formed first masking film is segmented by exposure to a second frequency of light.

* * * * *